(12) United States Patent
Tangring et al.

(10) Patent No.: US 11,616,178 B2
(45) Date of Patent: Mar. 28, 2023

(54) METHOD FOR PRODUCING A PLURALITY OF RADIATION-EMITTING SEMICONDUCTOR DEVICES WITH A SCREEN FOR A SCREEN PRINTING PROCESS

(71) Applicant: OSRAM Opto Semiconductors GmbH, Regensburg (DE)

(72) Inventors: Ivar Tangring, Regensburg (DE); Thomas Schlereth, Pentling (DE)

(73) Assignee: OSRAM OLED GMBH, Regensburg (DE)

( * ) Notice: Subject to any disclaimer, the term of this patent is extended or adjusted under 35 U.S.C. 154(b) by 98 days.

(21) Appl. No.: 16/500,946

(22) PCT Filed: Mar. 21, 2018

(86) PCT No.: PCT/EP2018/057150
§ 371 (c)(1),
(2) Date: Oct. 4, 2019

(87) PCT Pub. No.: WO2018/184846
PCT Pub. Date: Oct. 11, 2018

(65) Prior Publication Data
US 2020/0111938 A1      Apr. 9, 2020

(30) Foreign Application Priority Data
Apr. 4, 2017   (DE) .......................... 102017107226.8

(51) Int. Cl.
*H01L 33/60* (2010.01)
*H01L 33/48* (2010.01)
*H01L 33/52* (2010.01)

(52) U.S. Cl.
CPC ............ *H01L 33/60* (2013.01); *H01L 33/486* (2013.01); *H01L 33/52* (2013.01);
(Continued)

(58) Field of Classification Search
CPC ....... H01L 33/60; H01L 33/486; H01L 33/52; H01L 33/54; H01L 2933/0033;
(Continued)

(56) References Cited

U.S. PATENT DOCUMENTS 5,975,408 A * 11/1999 Goossen .............. B23K 20/023
228/173.2
9,490,398 B2   11/2016 Oyamada et al.
(Continued)

FOREIGN PATENT DOCUMENTS

CN     104300068 A     1/2015
CN     104752589 A     7/2015
(Continued)

OTHER PUBLICATIONS

English machine translation of CN 104752589 A (Year: 2015).*

*Primary Examiner* — Steven B Gauthier
*Assistant Examiner* — Candice Chan
(74) *Attorney, Agent, or Firm* — Slater Matsil, LLP

(57) ABSTRACT

A method for producing a plurality of radiation emitting semiconductor devices and a radiation emitting semiconductor device are disclosed. In an embodiment a method include providing an auxiliary carrier, applying a plurality of radiation-emitting semiconductor chips to the auxiliary carrier with front sides so that rear sides of the semiconductor chips are freely accessible, wherein each rear side of the respective semiconductor chip has at least one electrical contact, applying spacers to the auxiliary carrier so that the spacers directly adjoin side surfaces of the semiconductor chips and applying a casting compound between the semiconductor chips by a screen printing process such that a semiconductor chip assembly is formed, wherein a screen
(Continued)

for the screen printing process has a plurality of cover elements, and wherein each cover element covers at least one electrical contact.

13 Claims, 11 Drawing Sheets

(52) U.S. Cl.
CPC ............................ *H01L 2933/005* (2013.01); *H01L 2933/0033* (2013.01); *H01L 2933/0041* (2013.01)

(58) Field of Classification Search
CPC ....... H01L 2933/0041; H01L 2933/005; H01L 2933/0058; H01L 2224/96
See application file for complete search history.

(56) References Cited

U.S. PATENT DOCUMENTS

| | | |
|---|---|---|
| 9,673,364 B2 | 6/2017 | Nakabayashi |
| 9,899,574 B2 | 2/2018 | Pindl et al. |
| 10,217,913 B2 | 2/2019 | Pindl et al. |
| 10,971,662 B2 | 4/2021 | Cho et al. |
| 2011/0186867 A1* | 8/2011 | Singer ................. H01L 25/0753 257/88 |
| 2015/0050760 A1 | 2/2015 | Imazu et al. |
| 2016/0293810 A1 | 10/2016 | Baike et al. |
| 2016/0372642 A1 | 12/2016 | Cho et al. |
| 2017/0005245 A1 | 1/2017 | Hsu et al. |

FOREIGN PATENT DOCUMENTS

| | | |
|---|---|---|
| CN | 104854716 A | 8/2015 |
| CN | 105390595 A | 3/2016 |
| CN | 105723527 A | 6/2016 |
| CN | 106058006 A | 10/2016 |
| CN | 106257695 A | 12/2016 |
| DE | 102011087886 A1 | 6/2013 |
| EP | 3076444 A1 | 10/2016 |
| WO | 2015071109 A1 | 5/2015 |
| WO | 2016034472 A1 | 3/2016 |

* cited by examiner

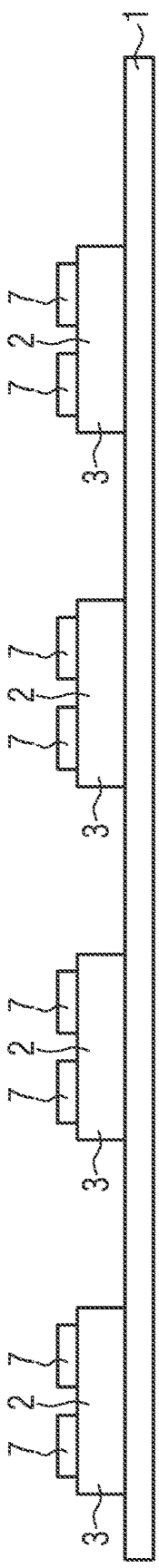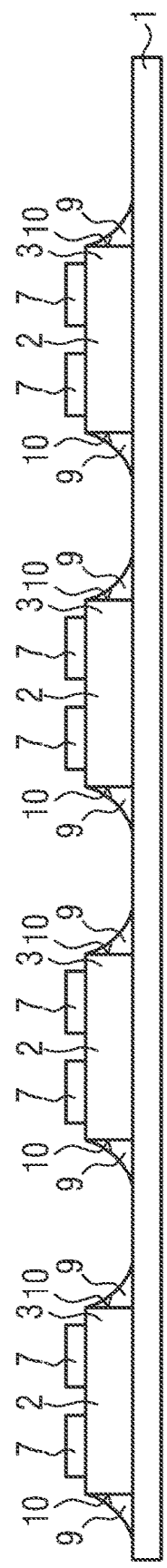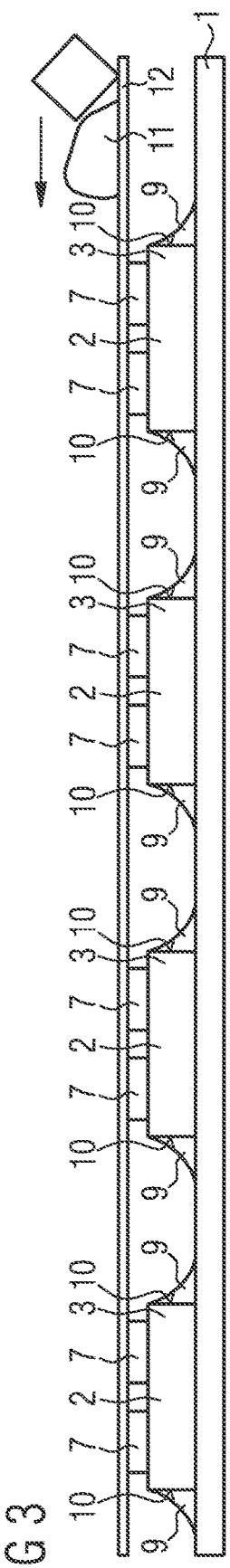

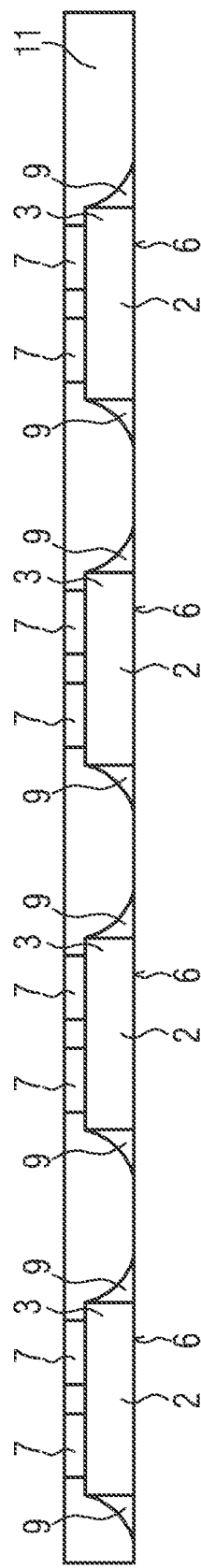
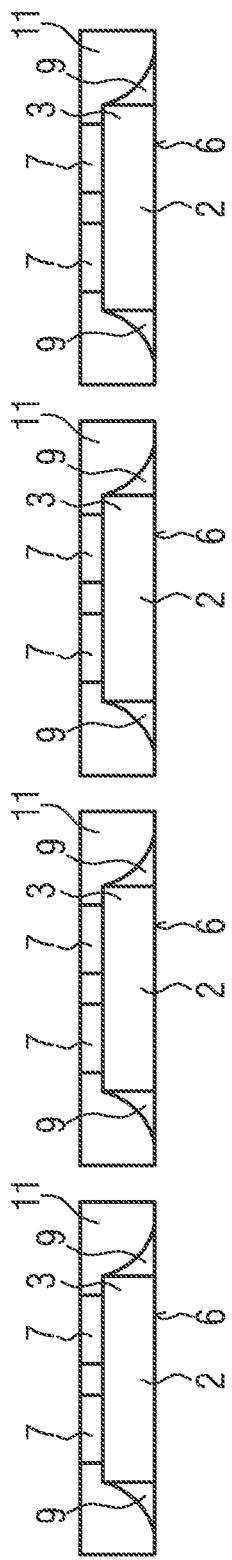

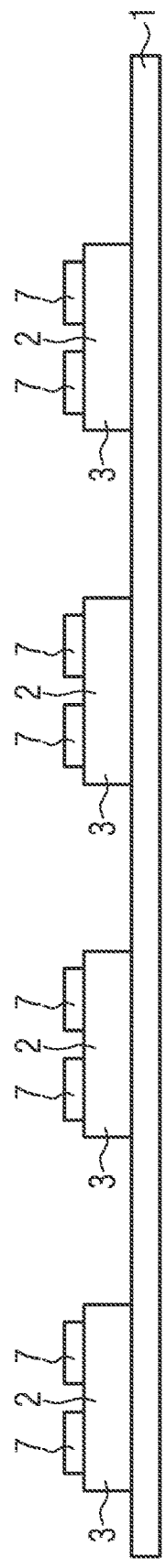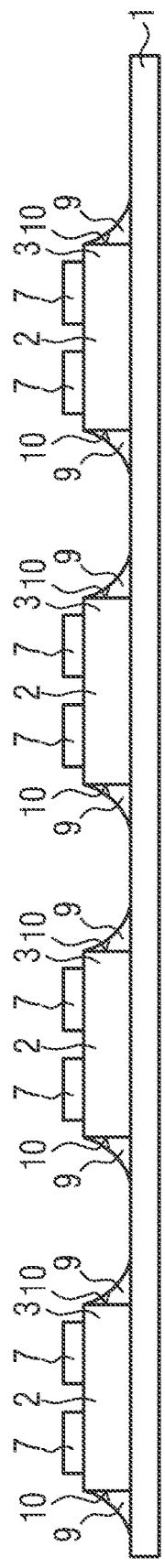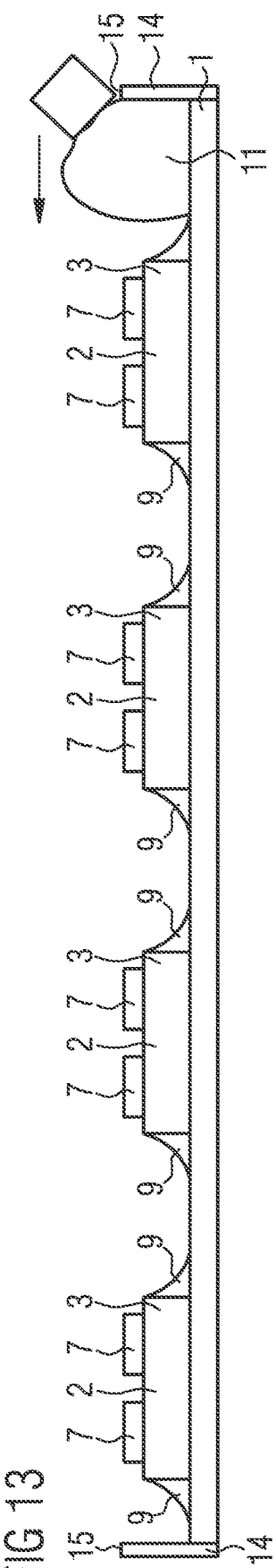

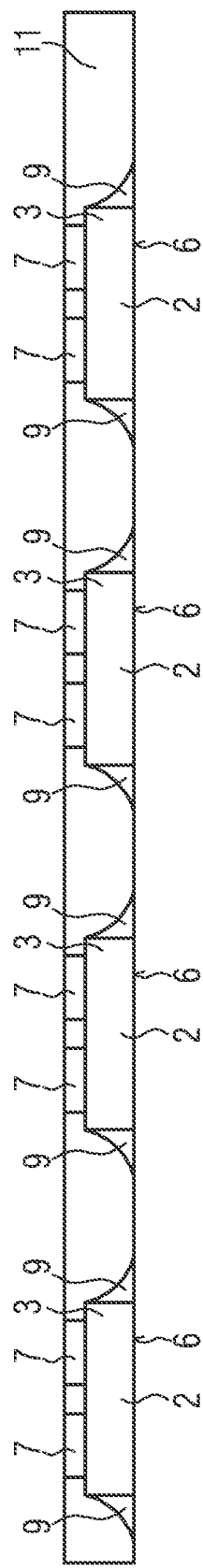
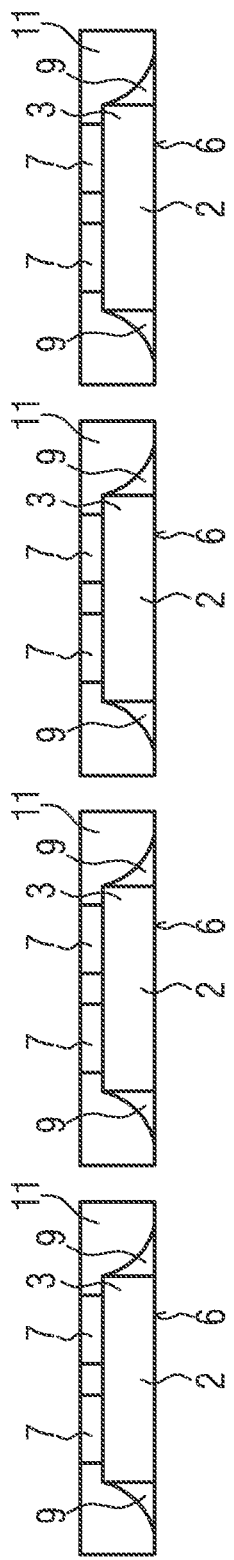

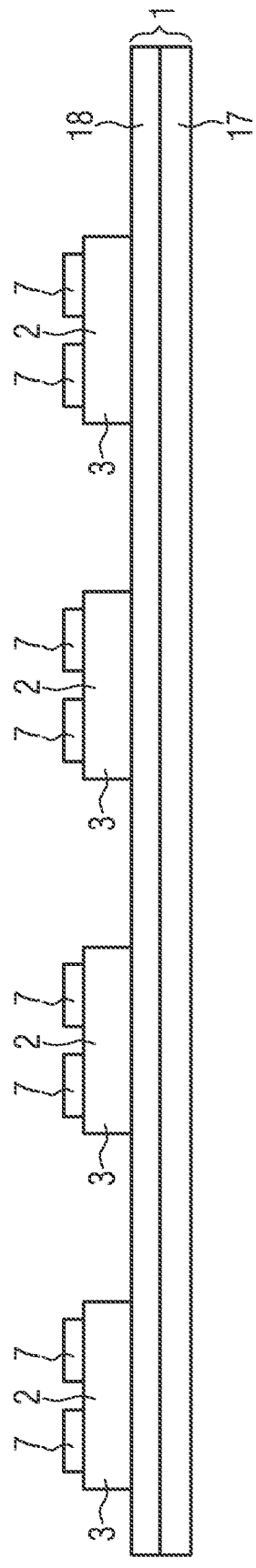
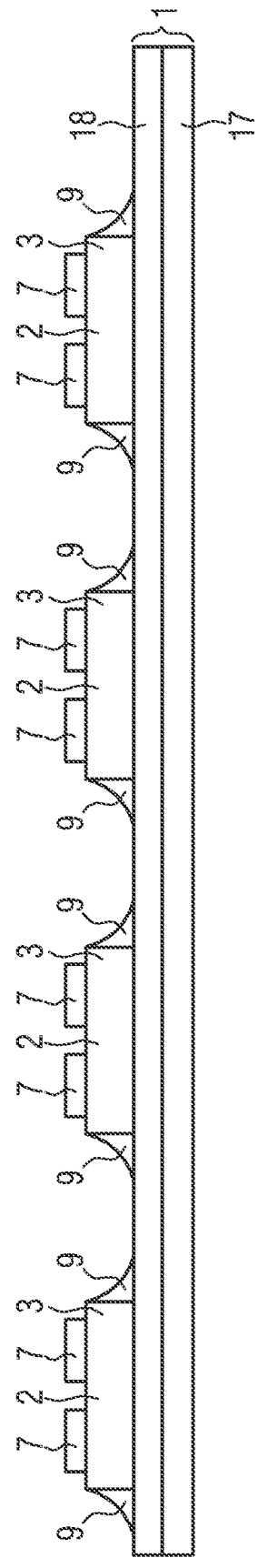
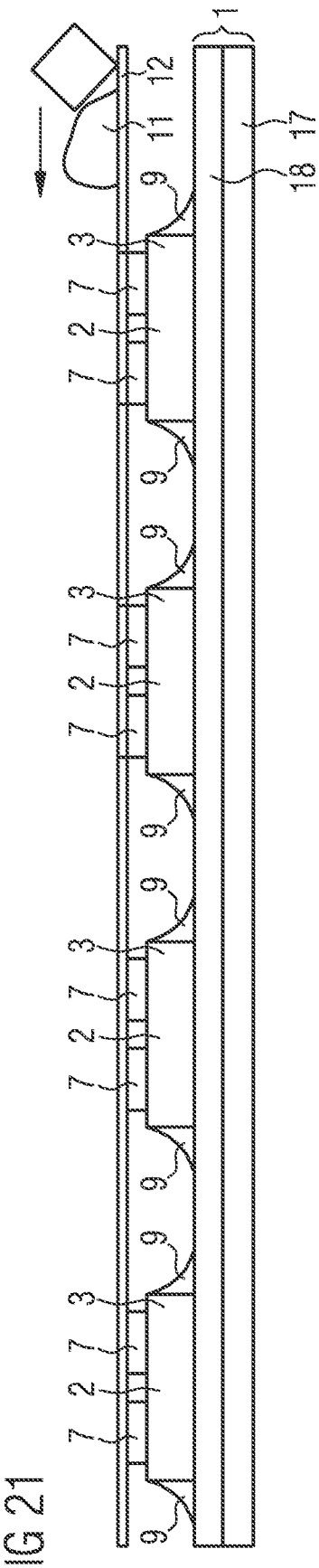

METHOD FOR PRODUCING A PLURALITY OF RADIATION-EMITTING SEMICONDUCTOR DEVICES WITH A SCREEN FOR A SCREEN PRINTING PROCESS

This patent application is a national phase filing under section 371 of PCT/EP2018/057150, filed Mar. 21, 2018, which claims the priority of German patent application 102017107226.8, filed Apr. 4, 2017, each of which is incorporated herein by reference in its entirety.

TECHNICAL FIELD

A method for manufacturing a plurality of radiation-emitting semiconductor devices and a radiation-emitting semiconductor device are provided.

BACKGROUND

For example, a method for manufacturing a plurality of radiation-emitting semiconductor devices and radiation-emitting semiconductor devices are described in documents U.S. Application Publication No. 2016/0293810 A1 and International Application Publication No. WO 2015/071109 A1.

SUMMARY OF THE INVENTION

Embodiments provide a method for the manufacture a plurality of radiation-emitting semiconductor devices, which have a small design and a lateral reflector. Further embodiments provide a radiation-emitting semiconductor device with an improved efficiency.

According to various embodiments during the method for manufacturing a plurality of radiation-emitting semiconductor devices, an auxiliary carrier is provided.

For example, the auxiliary carrier can have a basic body made of steel, glass or plastic. The basic body can, for example, be provided with an adhesive foil for fixing the semiconductor chips. Furthermore, it is also possible that a liquid adhesive is sprayed onto the auxiliary carrier for fixing the semiconductor chips.

According to an embodiment of the method, a plurality of radiation-emitting semiconductor chips is applied to the auxiliary carrier with their front sides. The rear sides of the semiconductor chips are freely accessible.

The front side of the semiconductor chip usually includes at least a part of the radiation exit surface of the semiconductor chip. For example, the semiconductor chip comprises a radiation-transmissive carrier with a first main surface that forms at least partially the radiation exit surface of the semiconductor chip. The rear side of the semiconductor chip is opposite its front side. For example, the rear side of the semiconductor chip is intended for mounting on a connection carrier.

According to a further embodiment of the method, a plurality of spacers is applied to the auxiliary carrier in such a way that the spacers are directly adjacent to the side surfaces of the semiconductor chips. Preferably, the spacers are formed by dispensing a transparent resin. The resin can be a silicone, for example.

According to a further embodiment of the method, a casting compound is applied between the semiconductor chips by means of screen printing or squeegees in such a way that a semiconductor chip assembly is formed. Preferably, a rear side of the semiconductor chips remains free of the casting compound at least in places, while applying the casting compound. In particular, this is usually with advantage with the application methods screen printing and squeegee. Particularly preferably, the rear side of the semiconductor chips comprises at least one electrical contact, the surface of which remains free of the casting compound at least in places, while the casting compound is applied. Particularly preferably, a second main surface of the electrical contact, which is turned away from the carrier, remains free of the casting compound at least in places. The electrical contact comprises a first main surface, which is opposite the second main surface and faces towards the carrier.

The semiconductor chips can be flip chips. A flip chip has a carrier with a second main surface on which a semiconductor layer sequence with a radiation-generating active zone has grown epitaxially. The carrier is usually transmissive to at least the electromagnetic radiation generated in the active zone. For example, the carrier has one of the following materials or is formed from one of the following materials: Sapphire, silicon carbide. The carrier has a second main surface opposite the first main surface. The first main surface of the carrier usually partially forms the radiation exit surface of the semiconductor chip. Furthermore, the side surfaces of the carrier usually also form part of the radiation exit surface of the semiconductor chip. Usually, two electrical contacts are arranged on the rear side of the flip chip and are intended for electrical contacting of the semiconductor chip. The front side of the flip chip is usually free of electrical contacts.

According to an embodiment of the method, flip chips are used as semiconductor chips, which have two electrical contacts on their rear side. The surfaces of the electrical contacts preferably remain free at least in places during the application of the casting compound. Particularly preferably, the casting compound completely envelopes the side surfaces of the electrical contacts, while a second main surface of each electrical contact, which faces away from the epitaxial semiconductor layer sequence, at least partially remains free of the casting compound during its application. Preferably, the second main surface of each electrical contact, which faces away from the epitaxial semiconductor layer sequence, remains completely free of the casting compound during its application.

According to a preferred embodiment of the method, each rear side of the semiconductor chip has at least one electrical contact and the casting compound is applied by screen printing. Herein, a screen for the screen printing process preferably has a plurality of cover elements, wherein each cover element covers at least one electrical contact during the screen printing process. According to an embodiment of the method, each cover element is slightly larger than the area to be covered, such as the second main surface of the electrical contact. For example, the cover element is up to 10% larger than the area to be covered.

For example, each semiconductor chip has one or two electrical contacts with a second main surface, wherein the second main surface is comprised by the rear side of the semiconductor chip. The second main surface of the electrical contact is preferably formed of a solderable coating, which is not completely removed during the whole method. In particular, the solderable coating remains particularly preferably embodied intact over the entire second main surface of the electrical contact and has no openings to an underlying material of the electrical contact. This has the advantage that the semiconductor device can be applied to a connection carrier by soldering its electrical contacts without having to renew the solderable coating.

For example, each semiconductor chip has two electrical contacts on its rear side that are covered by a cover element. In other words, the cover element completely covers both the second main surfaces of the two electrical contacts of a semiconductor chip and the interspace between the electrical contacts. This, the interspace between the two electrical contacts on the rear side of the semiconductor chip remains free of the casting compound with this embodiment of method.

The electrical contacts of the semiconductor chips can, for example, be applied galvanically and are usually made of a metallic material. Preferably, the electrical contacts of the semiconductor chip are comparatively thick. For example, the electrical contacts have a thickness between 30 micrometers and 75 micrometers, inclusive. Preferably, the electrical contacts have a thickness between 50 micrometers and 75 micrometers, inclusive. Electrical contacts that are comparatively thick have the advantage of providing mechanical stability to the semiconductor device and also serve as a mechanical buffer element that can absorb mechanical stress on the finished semiconductor device. In addition, thick contacts form an effective barrier to a solder layer with which the semiconductor device can be mounted on the rear of a connection carrier.

According to a further embodiment of the method, the casting compound is applied by means of squeegees. Particularly preferably, the auxiliary carrier is surrounded by a frame, which guides the squeegee in this embodiment of the method and. An edge of the frame preferably runs in the same plane as the second main surface of the electrical contacts of the semiconductor chips. In such a way, the height of the applied casting compound can be adjusted in such a way that the rear side of the semiconductor chips, on which, for example, at least one electrical contact is arranged, preferably remains free of the casting compound or only a very thin layer is formed on the rear side of the semiconductor chips or on the second main surface of the electrical contacts.

If the casting compound is applied by squeegees, the squeegee have an elastic material or is formed of an elastic material, where required. In such a way, by setting a suitable contact pressure when moving the squeegee over the semiconductor chips, it can be achieved that only a very thin residual layer of casting compound is formed on the rear side of the semiconductor chips, which, for example, is partly formed by the second main surface of the electrical contacts, or that no casting compound remains on the rear side of the semiconductor chips.

If the casting compound is applied by squeegees, it is possible that a thin residual layer of the casting compound is applied at least in places to the rear side of the semiconductor chips, which can be partly formed by the second main surface of the electrical contacts, when the casting compound is applied. With advantage, the thin residual layer of the casting compound can be removed with a further squeegee, a plasma treatment or a mechanical cleaning process. As a mechanical cleaning process, irradiation with water (wet blasting) is possible, for example. As plasma treatment, for example, treatment with a $CF_4$ plasma is possible.

The thin residual layer, for example, has a thickness between 200 nanometers and 1 micrometer, inclusive. Particularly preferable, the thickness of the residual layer is between 200 nanometers and 500 nanometers, inclusive.

According to a further embodiment of the method, the auxiliary carrier is removed from the semiconductor chip assembly and a wavelength-converting layer is applied to the main surface of the semiconductor chip assembly on which the auxiliary carrier was applied. The wavelength-converting layer converts electromagnetic radiation generated in the active zone of the semiconductor chip into electromagnetic radiation of a different wavelength range. For example, the semiconductor device emits electromagnetic radiation composed of converted and unconverted radiation and has, for example, a color location in the white region of the CIE chromaticity diagram.

For example, the wavelength-converting layer can be formed from a resin containing phosphor particles that give the wavelength-converting layer its wavelength-converting properties. Suitable materials for the resin of the wavelength-converting layer are, for example, silicone or epoxy or a mixture of these materials.

For example, the wavelength converting layer can have a thickness between 30 micrometer and 100 micrometer, inclusive. Preferably, the wavelength converting layer has a thickness of approximately 50 micrometer.

The wavelength converting layer can be applied by spraying, screen printing or squeegee, for example. It is also possible that the wavelength-converting layer is formed as a wavelength-converting silicone foil that is applied to the main surface of the semiconductor chip assembly, for example, by laminating. A further possibility for applying a wavelength-converting layer is an electrophoretic process in which phosphor particles from an electrophoresis bath are deposited on the surface to be coated using electromagnetic fields. A wavelength-converting layer applied by electrophoresis can also be provided with a resin that fixes the wavelength-converting layer.

According to a further embodiment of the method, the auxiliary carrier is at least partially wavelength-converting and remains at least partially in the finished semiconductor devices. For example, the auxiliary carrier has a wavelength-converting foil. It is possible that the wavelength-converting foil is applied to the base body of the auxiliary carrier, which is removed before the semiconductor devices are separated, while the wavelength-converting foil remains in the finished semiconductor devices.

According to a further embodiment of the method, the semiconductor chip assembly is separated into individual semiconductor devices, for example, with sawing or laser cutting.

According to a further embodiment of the method, the spacers are produced by dispensing a resin. The spacers usually each have a curved outer surface, whose shape is formed by the meniscus of the liquid resin. The outer surface of the spacer preferably runs from a rear side of the semiconductor chip to a front side of the semiconductor chip in such a way that a cross-sectional area of the spacer increases. The outer surface of the spacer can preferably be approximated by a plane having an angle between 40° and 75°, inclusive, with a normal of a main extension plane of the rear side of the semiconductor chip. Particularly preferably, the angle has a value of approximately 60°.

The casting compound is embodied preferably reflective, especially diffuse reflective. The reflective casting compound, for example, appears white. For example, the casting compound is formed of a transparent resin, such as silicone, in which reflective particles are incorporated, that give the casting compound its reflective properties. The reflective particles can, for example, be titanium dioxide particles. Preferably, the titanium dioxide particles in the resin have a fraction of at least 60% by weight and particularly preferably at least 70% by weight. In particular, the application techniques described here for the reflective casting compound, such as screen printing or squeegees, make it possible to apply such highly filled reflective casting compounds, whereas this is not possible with other application methods such as dispensing or spraying. For example, when dispensing, the processing of a casting compound with a filling level of at most about 40% to 45% by weight is only possible.

It is also possible that the casting compound contains other particles that contribute to the mechanical stability of the casting compound. Such particles are, for example, silicon dioxide particles.

According to a further embodiment of the method, a plurality of semiconductor chips is provided, in which at least the radiation exit surfaces are each already provided with a wavelength-converting layer.

The method described here is based on the idea of specifying an application method for the casting compound, wherein no or only a simple cleaning step of the rear side and in particular of the second main surface of the electrical contacts is required. In particular, it is possible with screen printing and squeegees for applying the casting compound to either not apply any material of the casting compound at all to the rear sides of the semiconductor chips and in particular to the second main surfaces of the electrical contacts or to apply only such a thin residual layer that this can be removed with a simple cleaning process.

The cleaning process is in particular suitable for preserving a metallization of the electrical contacts, which makes soldering of the electrical contacts possible. In other methods, such as those proposed in the International Application Publication No. WO 2015/071109 A1, in which the casting compound is applied in a thick layer to the rear side of the semiconductor chips, which must later be removed by grinding, such a solderable metallization is usually removed from the electrical contacts and must be reapplied after completion of the semiconductor devices.

The method described here is in particular suitable for manufacturing a radiation-emitting semiconductor device. The features described here in connection with the method can therefore also be embodied in the semiconductor device itself and vice versa.

According to an embodiment, a radiation-emitting semiconductor device comprises a semiconductor chip with an epitaxial semiconductor layer sequence, which is applied to a radiation-transmissive carrier. The semiconductor chip further comprises a mirror layer deposited on the epitaxial semiconductor layer sequence and two electrical contacts disposed on a rear side of the semiconductor chip. The rear side of the semiconductor chip is opposite a front side, which comprises a radiation exit surface of the semiconductor chip. The radiation exit surface of the semiconductor chip can, for example, have a first main surface of the radiation-transmissive carrier.

Furthermore, the semiconductor device comprises a spacer, which is disposed on side surfaces of the carrier and which has an oblique or curved outer surface. The spacer preferably runs along the entire outer surface of the semiconductor chip in a closed area around the semiconductor chip.

According to a further embodiment of the semiconductor chip, it comprises a casting compound which envelops the semiconductor chip and the spacer. Second main surfaces of the electrical contacts of the semiconductor chip are preferably freely accessible. The casting compound is preferably reflective. The casting compound preferably replaces a prefabricated housing and mechanically stabilizes the semiconductor device. The semiconductor device is preferably free of a prefabricated housing.

According to an embodiment of the radiation-emitting semiconductor device, the mirror layer has a cross-sectional area that is smaller than a cross-sectional area of the epitaxial semiconductor layer sequence, such that an undercut results between the epitaxial semiconductor layer sequence and the mirror layer. The undercut is particularly preferably at least partially filled with the reflective casting compound. The undercut results usually process technical specifications. By filling the undercut with the reflective casting compound, the efficiency of the semiconductor device can be increased with advantage, since in such a way less light that is emitted to the rear side of the semiconductor chip is lost. Preferably, the undercut is completely filled with the casting compound.

For example, the undercut has extending from the side surfaces of the carrier a depth of between 15 micrometer and 20 micrometer, inclusive.

According to a further embodiment of the radiation-emitting semiconductor device, a interspace between the electrical contacts is free of the casting compound. The interspace between the electrical contacts is completely free of the casting compound.

According to a further embodiment of the radiation-emitting semiconductor device, a radiation exit surface of the semiconductor chip is formed by a first main surface of the carrier and side surfaces of the carrier. The radiation exit surface of the semiconductor chip is preferably completely covered with a wavelength-converting layer.

For example, the semiconductor device is a light-emitting diode.

BRIEF DESCRIPTION OF THE DRAWINGS

Further advantageous embodiments and developments of the invention result from the exemplary embodiments described in the following in connection with the figures.

On the basis of the schematic sectional views of FIGS. 1 to 5, a method according to a first exemplary embodiment is described in more detail.

On the basis of the schematic sectional views of FIGS. 6 to 10, a method according to a further exemplary embodiment is described in more detail.

On the basis of the schematic sectional views of FIGS. 11 to 15, a method according to a further exemplary embodiment is described in more detail.

Figure 16:
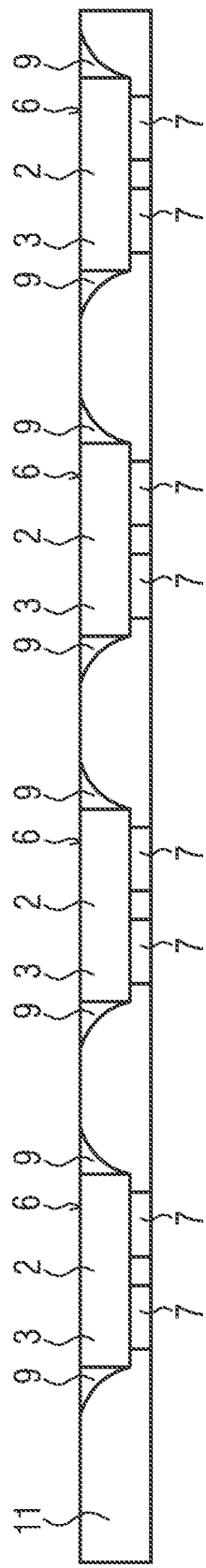
Figure 17:
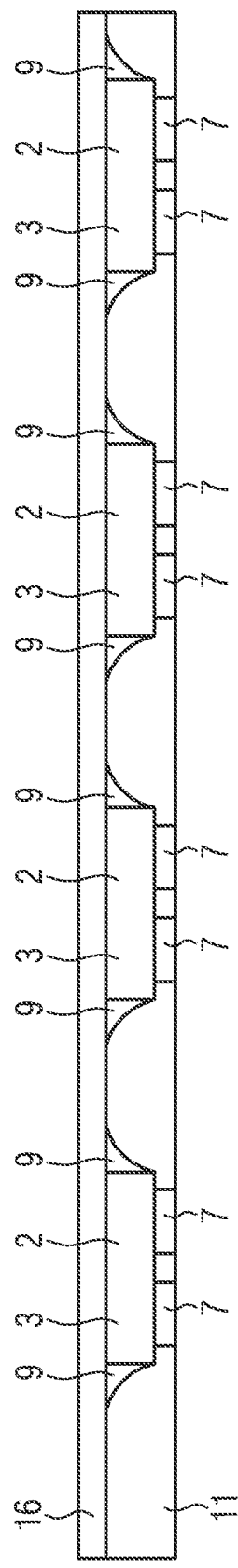
Figure 18:
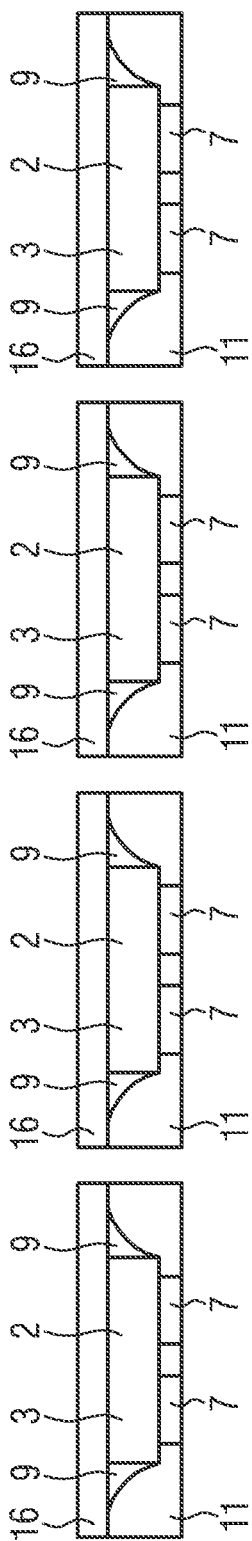

On the basis of the schematic sectional views of FIGS. 16 to 18, a method according to a further exemplary embodiment is described in more detail.

On the basis of the schematic sectional views of FIGS. 19 to 23, a method according to a further exemplary embodiment is described in more detail.

Each of the FIGS. 24 to 27 shows a radiation-emitting semiconductor device according to an exemplary embodiment.

Equal, similar elements as well as elements of equal function are designated with the same reference signs in the figures. The figures and the proportions of the elements shown in the figures are not regarded as being shown to scale. Rather, single elements, in particular layers, can be shown exaggerated in magnitude for the sake of better presentation and/or better understanding.

DETAILED DESCRIPTION OF ILLUSTRATIVE EMBODIMENTS

In the method according to the exemplary embodiment of the FIGS. 1 to 5, an auxiliary carrier 1 is provided in a first step, onto which a plurality of radiation-emitting semiconductor chips 2 is applied (FIG. 1). The semiconductor chips 2 have a radiation emitting carrier 3 with a first main surface and a second main surface opposite the first main surface. An epitaxial semiconductor layer sequence 4, which has an active zone 5, is applied to the second main surface of carrier 3. The active zone 5 is suitable for generating electromagnetic radiation. For reasons of clarity, the details of the semiconductor chip 2 are not shown in FIGS. 1 to 23, but can be taken from FIG. 24.

The first main surface of the carrier 3, together with the side surfaces of carrier 3, forms a radiation exit surface 6 of the semiconductor chip 2, from which the electromagnetic radiation generated in the active zone 5 is emitted. The first main surface of the carrier 3 forms at least partially a front side of the semiconductor chips 2.

The semiconductor chips 2 are with their front sides applied to the auxiliary carrier 1 so that rear sides of the semiconductor chips 2 are freely accessible. The rear sides of the semiconductor chips 2 are opposite the front side and each have two electrical contacts 7, which are intended for electrical contacting of the semiconductor chip 2. A second main surface of the electrical contacts 7 faces away from the carrier 3 and has a solderable coating 8, for example, made of a metal.

As shown schematically in FIG. 2, spacers 9, which are in direct contact with the side surfaces of carrier 3, are applied to the auxiliary carrier 1 in a next step of the method. A spacer 9 preferably completely surrounds a semiconductor chip 2. The spacers 9 can, for example, be applied to the auxiliary carrier 2 by dispensing a transparent resin. An outer surface 10 of the spacer 9 forms a curved surface, which corresponds to the meniscus of the resin. The spacers 9 are preferably made of a transparent resin, such as silicone.

In the next step, which is shown schematically in FIG. 3, a reflective casting compound 11 is applied between the semiconductor chips 2 by means of screen printing, so that a semiconductor chip assembly is formed. The casting compound 11 is particularly introduced in the interspaces between the semiconductor chips 2. The casting compound 11 fills the interspaces between the semiconductor chips 2, preferably completely up to the second main surface of the rear electrical contacts 7. The second main surfaces of the rear contacts 7, however, remain particularly preferably free of the casting compound 11 when applying the reflective casting compound 11.

Figure 4:
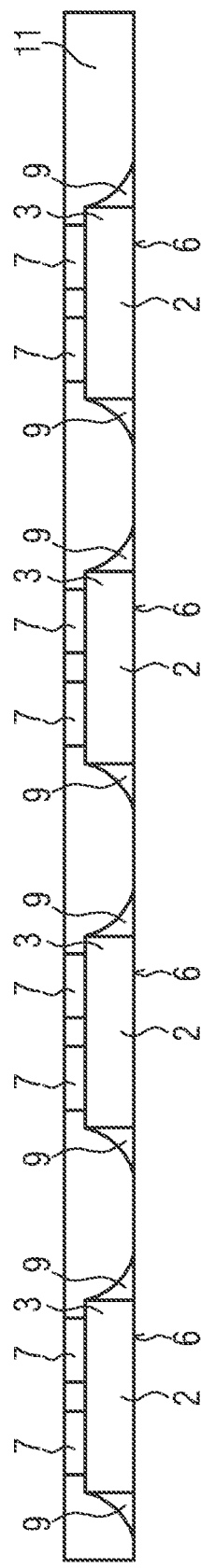
Figure 5:
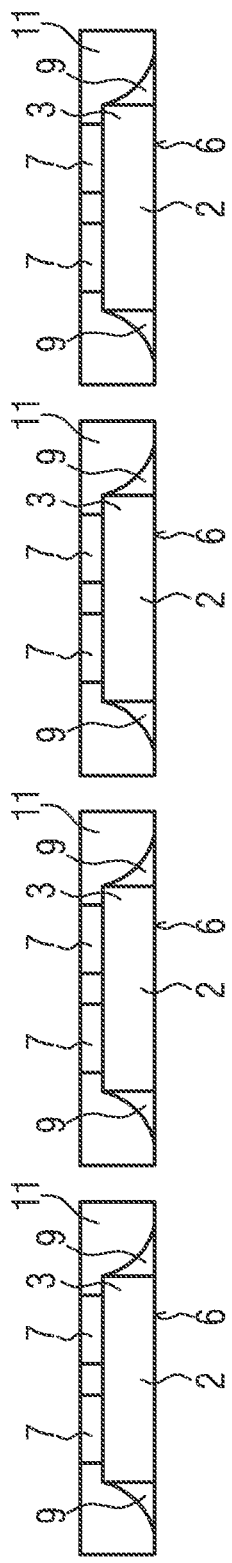
Figure 6:
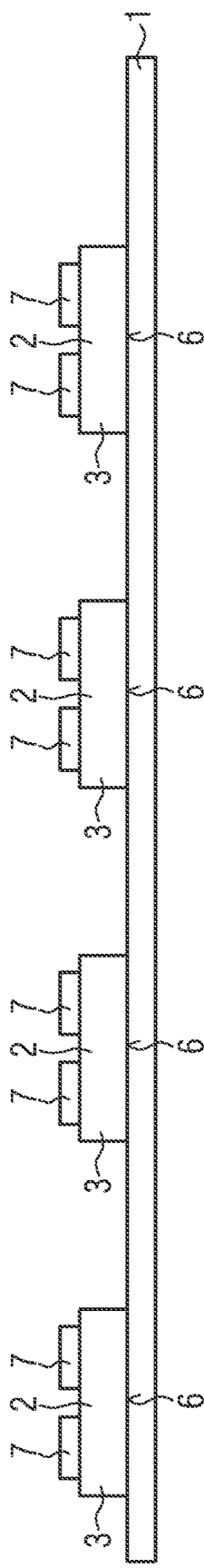

Then the auxiliary carrier 1 is removed from the semiconductor chip assembly (FIG. 4) and the semiconductor devices are separated, for example, by sawing (FIG. 5).

The casting compound 11 is preferably embodied reflective. For example, the casting compound 11 is made of a transparent silicone, in which reflective titanium dioxide particles are incorporated. Preferably, the titanium dioxide particles in the casting compound 11 have a high filling degree, preferably of at least 70% by weight.

Also, in the method according to the exemplary embodiment of FIGS. 6 to 10, an auxiliary carrier 1 is provided at first on which a plurality of semiconductor chips 2 is applied, as already described in connection with FIG. 1 (FIG. 6), for example.

Figure 7:
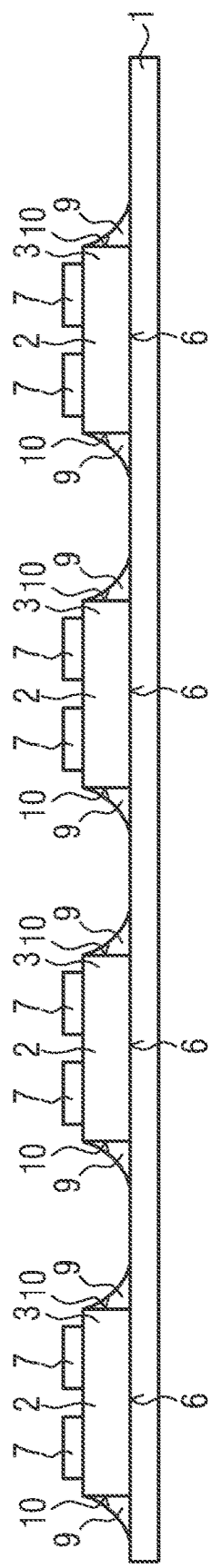

In a next step, spacers 9 are applied to the auxiliary carrier 1, as already described in connection with FIG. 2 (FIG. 7).

Figure 8:
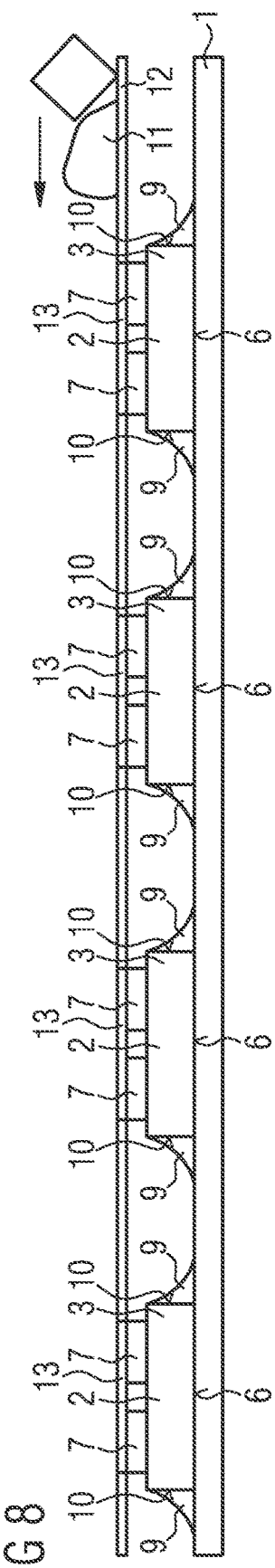

Then, a reflective casting compound 11 is applied to the auxiliary carrier 1 between the semiconductor chips 2 using a screen printing process. Herein, a screen 12 is used, which has a plurality of cover elements 13, which completely cover the electrical contacts 7 of a semiconductor chip 2. Each cover element 13 completely covers the two electrical contacts 7 of a semiconductor chip 2 and the interspaces between the electrical contacts 7 (FIG. 8). Particularly preferably, the cover elements 13 are slightly larger than the area to be covered, for example, by approximately 10%. For example, the semiconductor chip 2 has an area of approximately 1 millimeter by 1 millimeter, while the cover elements 13 have an area of 900 micrometers by 900 micrometers and project the electrical contacts 7 from their outer sides by 50 micrometers.

In a next step, the auxiliary carrier 1 is removed again (FIG. 9). The semiconductor devices are separated (FIG. 10).

In the exemplary embodiment according to FIGS. 11 to 15, an auxiliary carrier 1 is again provided on which semiconductor chips 2 and spacers 9 are applied, as already described in connection with FIGS. 1 and 2 (FIGS. 11 and 12).

Then, as schematically shown in FIG. 13, a reflective casting compound 11 is applied to the auxiliary carrier 1 between the semiconductor chips 2 by means of squeegees, so that a semiconductor chip assembly is formed. Herein, a frame 14 is arranged laterally of the auxiliary carrier 1, the edge 15 of which is arranged in a common plane with the second main surfaces of the electrical contacts 7. In such a way, the height of the applied casting compound 11 can be adjusted particularly well. Nevertheless, in this exemplary embodiment a thin residual layer of the reflective casting compound 11 remains at least in places on the electrical contacts 7 of the semiconductor chips 2. This is removed by a further cleaning step without removing the solderable coating on the second main surfaces of the electrical contacts 7.

Then the auxiliary carrier 1 is removed and the semiconductor devices are separated again (FIGS. 14 and 15).

In the method according to the exemplary embodiment of FIGS. 16 to 18, a semiconductor chip assembly is first generated, as described, for example, in connection with FIGS. 1 to 4 (FIG. 16).

Then, a wavelength-converting layer 16 is applied to the main surface of the semiconductor chip array, on which the auxiliary carrier 1 was previously applied, for example, using a method described in the general part (FIG. 17).

Then, the semiconductor devices are separated again (FIG. 18).

In contrast to the method according to the exemplary embodiment of FIGS. 1 to 5, in the method according to the exemplary embodiment of FIGS. 19 to 23 an auxiliary carrier 1, which partly remains in the finished semiconductor devices, is used.

The auxiliary carrier 1 comprises a base body 17 made of a mechanically stable material, such as steel or plastic, and a wavelength-converting foil 18, which is applied to the base body 17. The wavelength-converting foil 18, for example, is formed of a silicone, in which phosphor particles are incorporated. The wavelength-converting foil 18, for example, has a thickness of approximately 50 micrometers.

Figure 22:
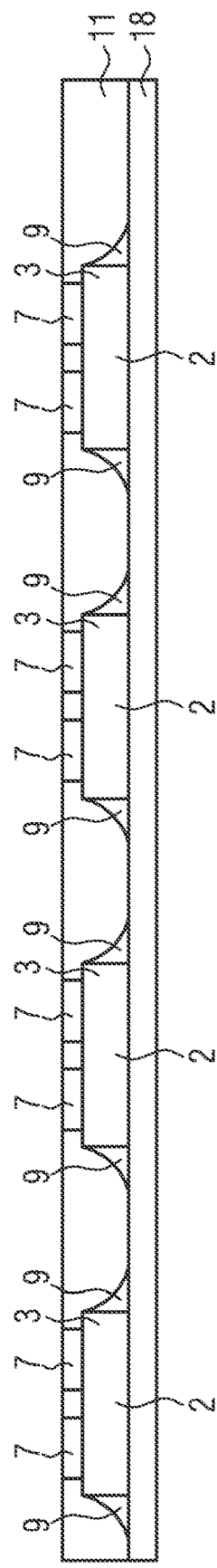

The semiconductor chips 2 are with their front sides applied to the wavelength-converting foil 18 and further processed, as already described in connection with FIGS. 2 to 3 (FIGS. 20 and 21). Then, the base body 17 of the auxiliary carrier 1 is removed from the semiconductor chip assembly, while the wavelength-converting foil 18 remains on the semiconductor chip assembly (FIG. 22).

Figure 23:
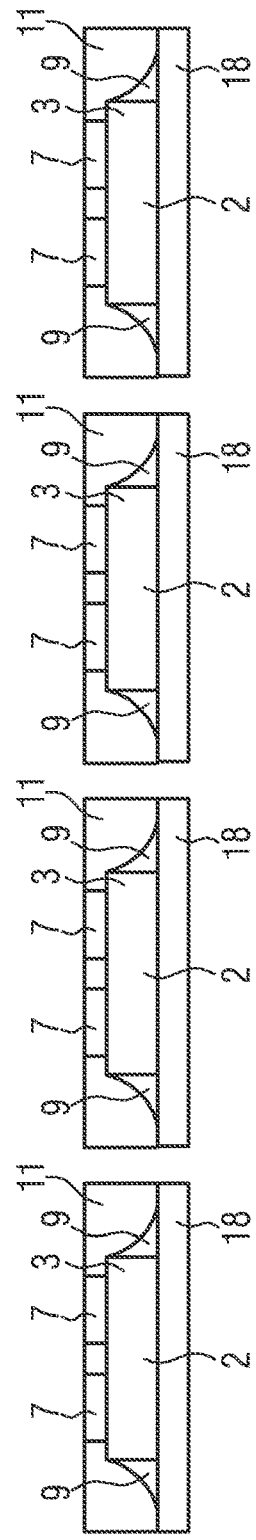

The semiconductor devices are then separated again (FIG. 23).

Figure 24:
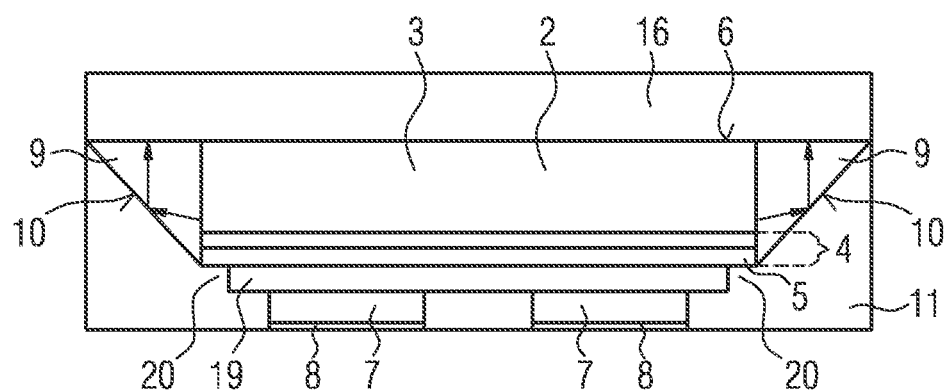

The radiation-emitting semiconductor device according to the exemplary embodiment of FIG. 24 has a radiation-transmissive carrier 3 made of sapphire, for example. An epitaxial semiconductor layer sequence 4 with an active zone 5 is applied to carrier 3. The active zone 5 generates electromagnetic radiation during operation of the semiconductor device. The electromagnetic radiation is emitted from a radiation exit surface 6 of the semiconductor chip 2. At present, the radiation exit surface comprises a first main surface of carrier 3 opposite the epitaxial semiconductor layer sequence 4 as well as the side surfaces of carrier 2.

A mirror layer 19, which is intended to direct electromagnetic radiation, which is generated in the active zone 5, to the radiation exit surface 6, is applied to the epitaxial semiconductor layer sequence 4. The mirror layer 19 has a cross-sectional area, which is smaller than the cross-sectional area of the epitaxial semiconductor layer sequence 4. In such a way an undercut 20 is formed between the epitaxial semiconductor layer sequence 4 and the mirror layer 19.

In the exemplary embodiment according to FIG. 24, this undercut 20 is at least partially and particularly preferably completely filled by a reflective casting compound 11. The reflective casting compound 11 forms side surfaces of the semiconductor device. It serves for mechanical stabilization of the semiconductor device and replaces a prefabricated housing.

The side surfaces of carrier 3 are completely covered with a spacer 9, which has an oblique or curved outer surface 10. The outer surface 10 of the spacer 9 is completely enveloped by the reflective casting compound 11. An interspace between electrical contacts 7, which are arranged on the rear side of the semiconductor chip 2, is also completely filled with the reflective casting compound 11. The outer surface 10 of the spacer 9, together with the reflective casting compound 11, forms a reflector, which directs electromagnetic radiation, which exits from the side surfaces of the carrier 3, to a front side of the semiconductor device (see arrows in the Figure).

A wavelength converting layer 16, which is suitable to convert radiation of the first wavelength range into radiation of a second wavelength range, which is different from the first wavelength range, is disposed on the first main surface of the carrier 3. The wavelength-converting layer 16 is laterally flush with the reflecting casting compound 11.

For example, the semiconductor device according to FIG. 24 can be manufactured using a method according to FIGS. 16 to 18. The method allows it with advantage that the second main surfaces of the electrical contacts 7 remain freely accessible when the reflective casting compound 11 is applied. This also preserves a solderable coating 8 on the second main surfaces of the electrical contacts 7 and must not be applied again subsequently.

Figure 25:
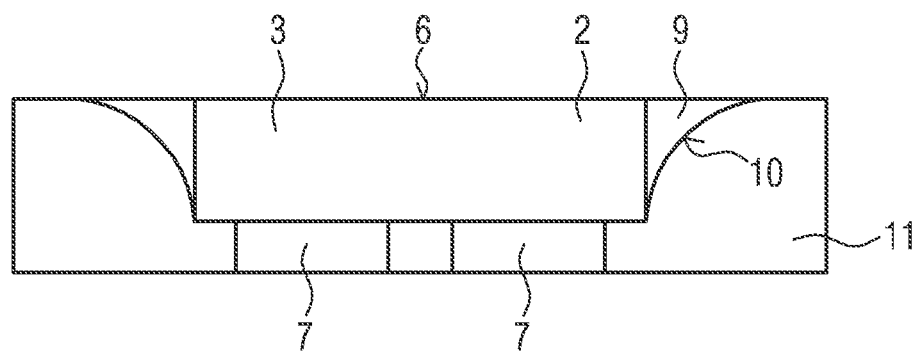

In contrast to the radiation-emitting semiconductor device according to FIG. 24, the radiation-emitting semiconductor device according to the exemplary embodiment of FIG. 25 has an interspace between the rear electrical contacts 7 of the semiconductor chip 2, which is free of the reflective casting compound 11. Such a semiconductor device can, for example, be produced using a method as already described in connection with FIGS. 6 to 10. Furthermore, the semiconductor device according to FIG. 25 is free of a wavelength converting layer 9. Therefore, the semiconductor device emits unconverted, preferably blue, light.

Figure 26:
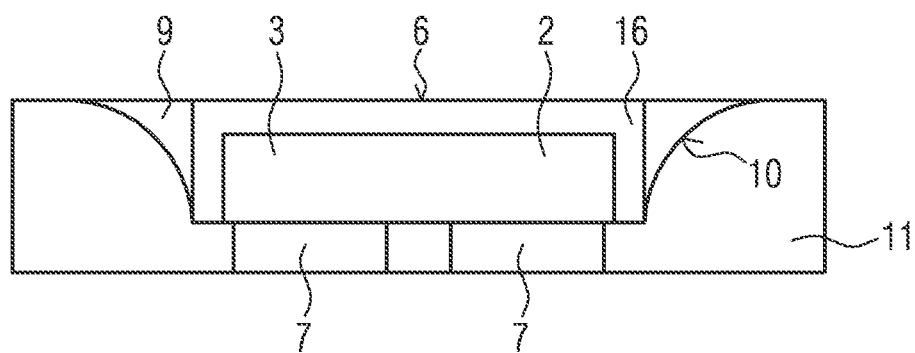

In contrast to the semiconductor device according to FIG. 24, the radiation-emitting semiconductor device according to the exemplary embodiment of FIG. 26 has a wavelength-converting layer 16, which is applied directly to the radiation exit surface 6 of the semiconductor chip 2. The interspace between the electrical contacts 7 of the semiconductor chip 2 is completely filled with the reflective casting compound 11 up to the second main surfaces of the electrical contacts 7 of the semiconductor chip 2.

Figure 27:
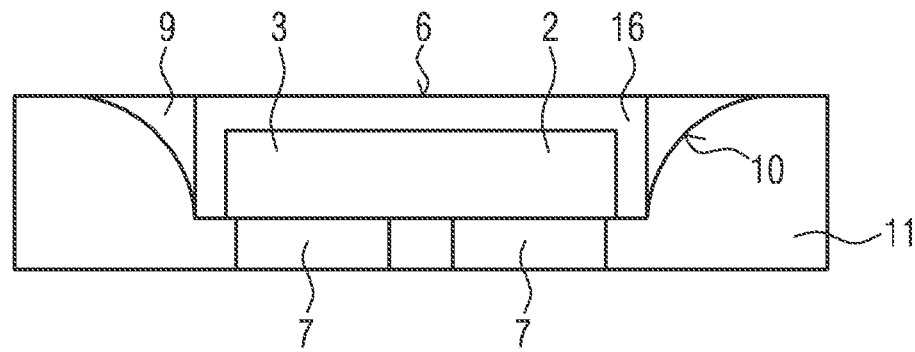

In contrast to the semiconductor device according to FIG. 25, the radiation-emitting semiconductor device according to the exemplary embodiment of FIG. 27 has a wavelength-converting layer 16, which is applied directly to the radiation exit surface 6 of the semiconductor chip 2. The interspace between the electrical contacts 7 of the semiconductor chip 2 is completely free of the reflective casting compound 11.

The invention is not limited by the description of the exemplary embodiment to these. Rather, the invention includes each new feature as well as each combination of features, which in particular includes each combination of features in the patent claims, even if that feature or combination itself is not explicitly stated in the patent claims or exemplary embodiment.

The invention claimed is:

1. A method for manufacturing a plurality of radiation-emitting semiconductor devices, the method comprising:
    providing an auxiliary carrier;
    applying a plurality of radiation-emitting semiconductor chips with front sides to the auxiliary carrier so that rear sides of the semiconductor chips are freely accessible, wherein each rear side of a respective semiconductor chip has two electrical contacts;
    applying spacers to the auxiliary carrier so that the spacers directly adjoin side surfaces of the semiconductor chips; and
    applying a casting compound between the semiconductor chips by a screen printing process such that a semiconductor chip assembly is formed,
    wherein a screen for the screen printing process has a plurality of cover elements,
    wherein each cover element covers at least one electrical contact,
    wherein each semiconductor chip comprises an epitaxial semiconductor layer sequence and a mirror layer,
    wherein the mirror layer is arranged between the semiconductor layer sequence and the electrical contacts, and
    wherein the mirror layer has a cross-sectional area that is smaller than a cross-sectional area of the epitaxial semiconductor layer sequence forming an undercut.

2. The method according to claim 1, further comprising separating the semiconductor chip assembly into individual semiconductor devices.

3. The method according to claim 1, wherein the semiconductor chips comprise radiation exit surfaces with a wavelength-converting layer.

4. The method according to claim 1,
    wherein the electrical contacts have a main surface, and
    wherein the main surface of the electrical contacts is formed of a solderable coating, which is not removed during the method.

5. The method according to claim 1, wherein the rear sides of the semiconductor chips remain at least in places free of the casting compound while applying the casting compound.

6. The method according to claim 1, wherein each cover element covers the two electrical contacts of the respective semiconductor chip.

7. The method according to claim 1, further comprising:
    removing the auxiliary carrier from the semiconductor chip assembly; and applying a wavelength-converting layer to a first main surface of the semiconductor chip assembly to which the auxiliary carrier was applied.

8. The method according to claim 1, wherein the auxiliary carrier is at least partially wavelength-converting and at least partially remains in the semiconductor devices.

9. The method according to claim 1, further comprising producing the spacers by dispensing a liquid resin, wherein each spacer has a curved outer surface whose shape is formed by a meniscus of the liquid resin.

10. The method according to claim 1, further comprising forming the casting compound from a resin into which reflecting particles are introduced so that the casting compound is a reflective casting compound.

11. The method according to claim 10, wherein the reflecting particles are titanium dioxide particles and have a fraction of at least 60% by weight in the resin.

12. The method according to claim 1, wherein the cover element is up to 10% larger than the electrical contacts.

13. The method according to claim 1, wherein the electrical contacts have a thickness of between 50 μm and 75 μm, inclusive.

\* \* \* \* \*